(12) United States Patent
Liao et al.

(10) Patent No.: US 12,469,833 B2
(45) Date of Patent: Nov. 11, 2025

(54) PACKAGE STRUCTURE AND MANUFACTURING METHOD THEREOF

(71) Applicant: POWERTECH TECHNOLOGY INC., Hsinchu County (TW)

(72) Inventors: Ching-Wei Liao, Hsinchu County (TW); Shang-Yu Chang Chien, Hsinchu County (TW)

(73) Assignee: POWERTECH TECHNOLOGY INC., Hsinchu County (TW)

( * ) Notice: Subject to any disclaimer, the term of this patent is extended or adjusted under 35 U.S.C. 154(b) by 408 days.

(21) Appl. No.: 18/209,500

(22) Filed: Jun. 14, 2023

(65) Prior Publication Data

US 2024/0021595 A1  Jan. 18, 2024

(30) Foreign Application Priority Data

Jul. 13, 2022  (TW) .................................. 111126206

(51) Int. Cl.
| | |
|---|---|
| *H01L 25/16* | (2023.01) |
| *H01L 21/48* | (2006.01) |
| *H01L 21/56* | (2006.01) |
| *H01L 23/48* | (2006.01) |
| *H01L 23/498* | (2006.01) |

(Continued)

(52) U.S. Cl.
CPC ........ *H01L 25/167* (2013.01); *H01L 21/4857* (2013.01); *H01L 21/56* (2013.01); *H01L 23/481* (2013.01); *H01L 23/49816* (2013.01); *H01L 23/5383* (2013.01); *H01L 23/5385* (2013.01); *H01L 23/5389* (2013.01); *H01L 24/16* (2013.01); *H01L 24/32* (2013.01); *H01L 24/73* (2013.01); *H01L 2224/16225* (2013.01); *H01L 2224/32225* (2013.01); *H01L 2224/73204* (2013.01)

(58) Field of Classification Search
CPC .... H01L 25/167; H01L 21/4857; H01L 21/56
See application file for complete search history.

(56) References Cited

U.S. PATENT DOCUMENTS

| | | | |
|---|---|---|---|
| 2020/0161518 A1* | 5/2020 | Lin | .................... H01L 23/3121 |
| 2020/0266180 A1* | 8/2020 | Pendse | .................... H01L 24/24 |
| 2021/0351145 A1 | 11/2021 | Patil | |

(Continued)

*Primary Examiner* — Errol V Fernandes
(74) *Attorney, Agent, or Firm* — Winston Hsu

(57) ABSTRACT

A package structure and a manufacturing method thereof are provided. The package structure includes a first package and a second package, and the second package is disposed on the first package. The first package includes a first redistribution layer, at least one chip and a second redistribution layer. The chip is disposed between the first redistribution layer and the second redistribution layer. The second package includes a third redistribution layer and at least three light-emitting elements. The third redistribution layer is electrically connected to the second redistribution layer, and the second redistribution layer is disposed between the chip and the third redistribution layer. The light-emitting elements are disposed on the third redistribution layer and electrically connected to the third redistribution layer. Each light-emitting element includes a first surface opposite to the third redistribution layer, and the first surfaces of the light-emitting elements are coplanar.

20 Claims, 10 Drawing Sheets

(51) Int. Cl.
*H01L 23/538* (2006.01)
*H01L 23/00* (2006.01)

(56) References Cited

U.S. PATENT DOCUMENTS

2022/0189864 A1  6/2022  Yazdani
2023/0178520 A1* 6/2023  Lin ..................... H10H 20/018
                                                    257/91

* cited by examiner

PACKAGE STRUCTURE AND MANUFACTURING METHOD THEREOF

BACKGROUND OF THE INVENTION

1. Field of the Invention

The present invention relates to a package structure and a manufacturing method thereof, and more particularly to a package structure including at least three light-emitting elements and a manufacturing method thereof.

2. Description of the Prior Art

In recent years, due to the miniaturization and high density of electronic elements in electronic devices, the packaging technology for integrating multiple electronic elements or integrated circuits has been developed. In order to reduce the area of a package structure, it has been developed towards a three-dimensional stacking structure. However, the number of redistribution layers (RDLs) increases in this structure, resulting in more serious warpage, which will affect the planarity of this structure. Therefore, it is still required to continuously develop suitable designs of the package structure.

SUMMARY OF THE INVENTION

An embodiment of the present invention provides a package structure including a first package and a second package, and the second package is disposed on the first package. The first package includes a first redistribution layer, at least one chip and a second redistribution layer. The chip is disposed on the first redistribution layer. The second redistribution layer is disposed on a side of the chip opposite to the first redistribution layer and electrically connected to the first redistribution layer. The second package includes a third redistribution layer and at least three light-emitting elements. The third redistribution layer is electrically connected to the second redistribution layer, and the second redistribution layer is disposed between the chip and the third redistribution layer. The light-emitting elements are disposed on the third redistribution layer and electrically connected to the third redistribution layer. Each of the light-emitting elements includes a first surface having a light-emitting region for generating light. The first surface is opposite to the third redistribution layer, and the first surfaces of the light-emitting elements are coplanar.

An embodiment of the present invention provides a manufacturing method of a package structure. First, a first package is formed, which including: forming a first redistribution layer on a first carrier; forming a plurality of conductive pillars on the first redistribution layer, and disposing a chip on the first redistribution layer; forming a first encapsulant material on the first redistribution layer, wherein the first encapsulant material surrounds the chip and the conductive pillars; forming a second redistribution layer on the first encapsulant material, and electrically connecting the second redistribution layer to the chip, wherein the second redistribution layer is electrically connected to the first redistribution layer through the conductive pillars; and removing the first carrier. Then, a second package is formed. The second package includes a third redistribution layer and at least three light-emitting elements. The light-emitting elements are disposed on the third redistribution layer and electrically connected to the third redistribution layer. Each of the light-emitting elements includes a first surface having a light-emitting region for generating light. The first surface is opposite to the third redistribution layer, and the first surfaces of the light-emitting elements are coplanar. Then, the second package is bonded to the first package. The third redistribution layer is electrically connected to the second redistribution layer, and the second redistribution layer is disposed between the chip and the third redistribution layer.

These and other objectives of the present invention will no doubt become obvious to those of ordinary skill in the art after reading the following detailed description of the preferred embodiment that is illustrated in the various figures and drawings.

DETAILED DESCRIPTION

The present invention may be understood by reference to the following detailed description, taken in conjunction with the drawings as described below. It is noted that, for purposes of illustrative clarity and being easily understood by the readers, various drawings of this invention show at least a portion of the package structure or at least a portion of the steps of manufacturing the package structure, and certain elements in various drawings may not be drawn to scale. In addition, the number and dimension of each element shown in drawings are only illustrative and are not intended to limit the scope of the present invention.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". When the terms "include", "comprise" and/or "have" are used in the description of the present invention, the corresponding features, regions, steps, operations and/or components would be pointed to existence, but not limited to the existence or addition of one or more corresponding features, regions, steps, operations, components and/or combinations thereof.

It should be understood that when an element or layer is referred to as being "on" or "connected to" another element or layer, it may be directly on or directly connected to the other element or layer, or intervening elements or layers may be presented. In contrast, when an element is referred to as being "directly on" or "directly connected to" another element or layer, there are no intervening elements or layers presented.

When an element is "electrically connected to" or "coupled to" another element, it may include the condition that "other elements may further be present between the element and the another element to electrically connect the element to the another element" or the condition that "the element is directly electrically connected to the another element without other elements therebetween". When an element is "directly electrically connected to" or "directly coupled to" another element, it means the condition that "the element is directly electrically connected to the another element without other elements therebetween".

It should be noted that the technical features in different embodiments described in the following can be replaced, recombined, or mixed with one another to constitute another embodiment without departing from the spirit of the present invention.

Figure 1:
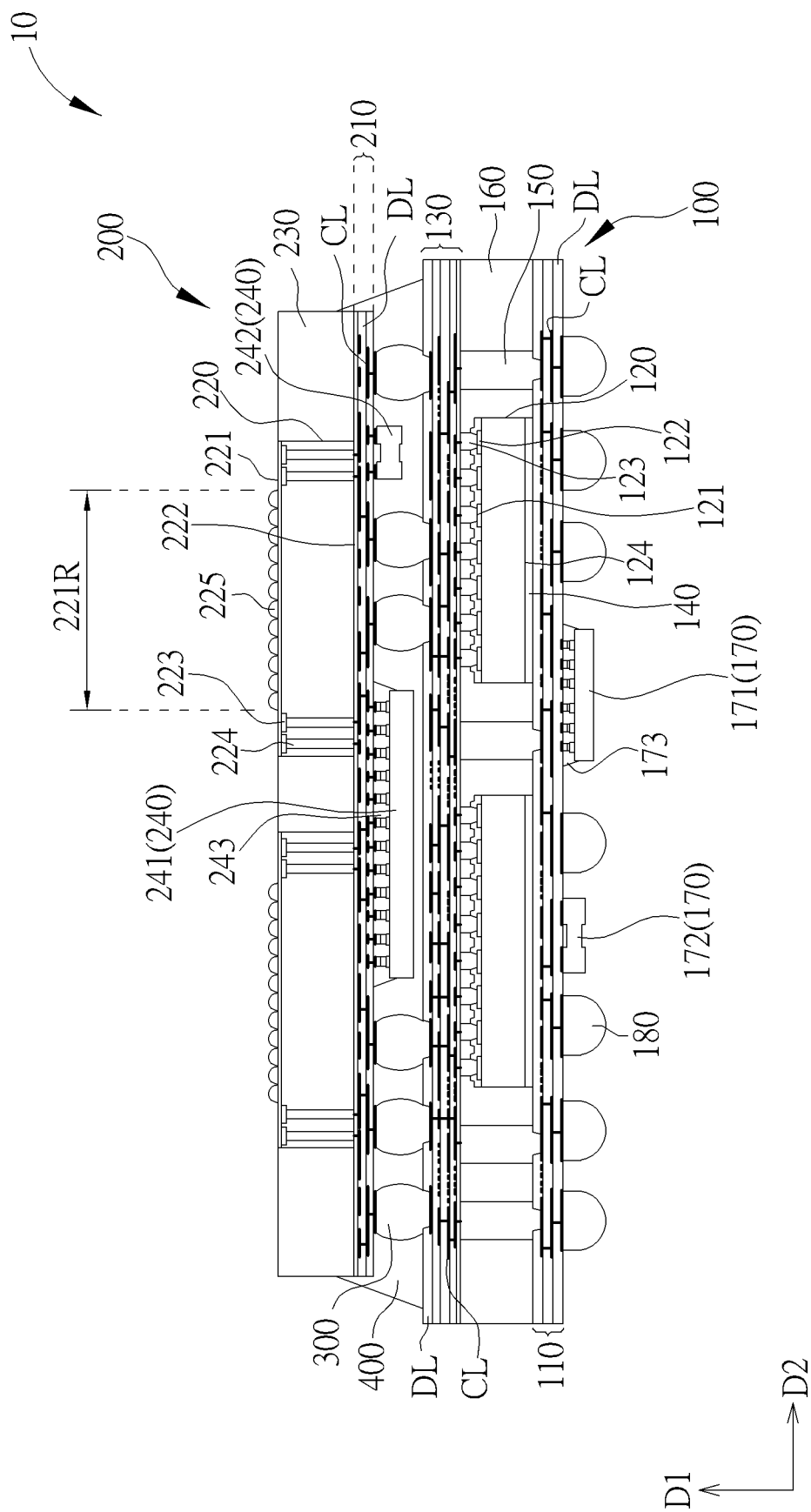
FIG. 1 is a cross-sectional schematic diagram of a package structure according to an embodiment of the present invention.
Figure 2:
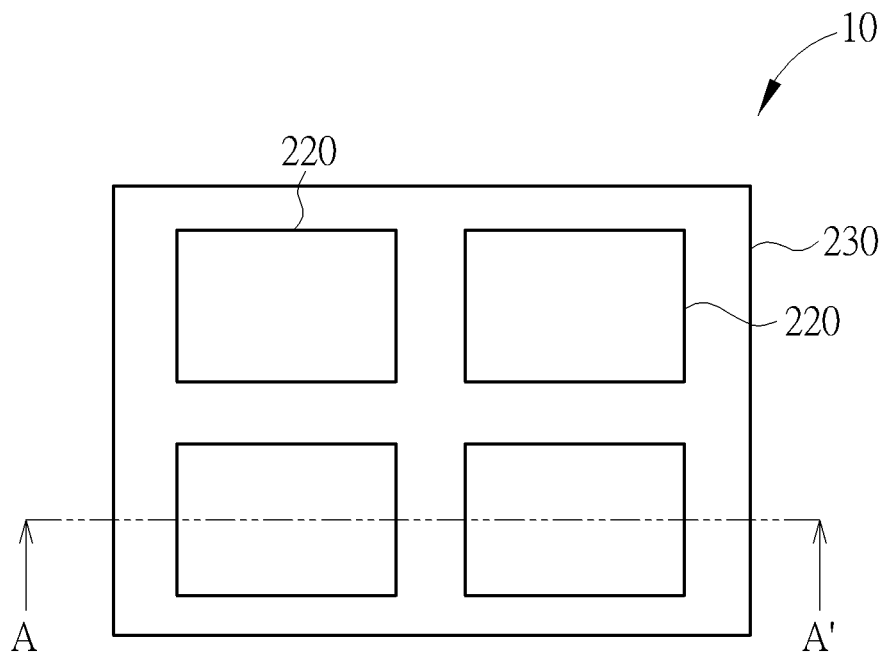
FIG. 2 is a top-view schematic diagram of a package structure according to an embodiment of the present invention.

Please refer to FIG. 1 and FIG. 2. FIG. 1 is a cross-sectional schematic diagram of a package structure according to an embodiment of the present invention. FIG. 2 is a top-view schematic diagram of a package structure according to an embodiment of the present invention, wherein FIG. 1 is, for example, a cross-sectional schematic diagram along a section line A-A' in FIG. 2. As shown in FIG. 1 and FIG. 2, a package structure 10 according to an embodiment of the present invention may include a first package 100 and a second package 200, and the second package 200 is disposed on the first package 100. For example, the second package 200 may be stacked on the first package 100 along a first direction D1, and the first direction D1 may be parallel to and opposite to a top-view direction of the package structure 10, but not limited herein.

The first package 100 may include a first redistribution layer 110, at least one chip 120 and a second redistribution layer 130. The chip 120 is disposed on the first redistribution layer 110. The second redistribution layer 130 is disposed on a side of the chip 120 opposite to the first redistribution layer 110, that is, the first redistribution layer 110 and the second redistribution layer 130 may be respectively disposed on opposite two sides of the chip 120, and the second redistribution layer 130 is electrically connected to the first redistribution layer 110.

The second package 200 may include a third redistribution layer 210 and at least three light-emitting elements 220. The third redistribution layer 210 is electrically connected to the second redistribution layer 130, and the second redistribution layer 130 is disposed between the chip 120 and the third redistribution layer 210 in the first direction D1. The light-emitting elements 220 are disposed on the third redistribution layer 210 and electrically connected to the third redistribution layer 210. Each of the light-emitting elements 220 may include a first surface 221 having a light-emitting region 221R for generating light. The first surface 221 is opposite to the third redistribution layer 210, that is, the first surface 221 faces a side of the light-emitting element 220 opposite to the third redistribution layer 210, and the first surfaces 221 of these light-emitting elements 220 are coplanar. The "coplanar" may mean, for example, that the planes respectively extended from the first surfaces 221 of the light-emitting elements 220 in a second direction D2 are substantially coincident with or aligned with each other, and the second direction D2 may be perpendicular to the first direction D1, but not limited herein. By packaging at least three light-emitting elements 220 in the second package 200 in such a way that the first surfaces 221 are coplanar, the second package 200 may have better surface planarity.

As shown in FIG. 1, each of the first redistribution layer 110, the second redistribution layer 130 and the third redistribution layer 210 may include at least one conductive layer CL and at least one dielectric layer DL, such as respectively including a plurality of conductive layers CL and a plurality of dielectric layers DL, but not limited herein. In some embodiments, the number of the conductive layers CL and the number of the dielectric layers DL in the first redistribution layer 110, the second redistribution layer 130 and the third redistribution layer 210 may be adjusted according to practical requirements. The conductive layers CL and the dielectric layers DL may be stacked alternately to form a redistribution layer, thereby redistributing wirings.

In some embodiments, the first redistribution layer 110 and the second redistribution layer 130 may have similar or the same number of conductive layers CL, so that the stresses on the upper side and the lower side of the chip 120 may be more balanced to reduce the warpage, thereby increasing the planarity of the whole structure. Specifically, since the chip 120 may be electrically connected to and transmit signals to the light-emitting elements 220 through the second redistribution layer 130 and the third redistribution layer 210, a portion of the conductive layers CL in the third redistribution layer 210 may be used as wirings for signal transmission between the chip 120 and the light-emitting elements 220 in design, and the number of the conductive layers CL in the second redistribution layer 130 may be correspondingly reduced. Through the above design of structure, the number of the conductive layers CL in the second redistribution layer 130 may be similar to or the same as the number of the conductive layers CL in the first redistribution layer 110, thereby reducing the warpage of the first package 100.

As shown in FIG. 1, the first package 100 may include at least one chip 120 or a plurality of chips 120. For example, the chips 120 may correspond to the light-emitting elements 220 one-to-one and control the light-emitting elements 220, but not limited herein. In some embodiments, the number of the chips 120 in the first package 100 may be adjusted according to practical requirements. The chip 120 may include active elements and/or passive elements. The active elements may include diodes, transistors, integrated circuits, photoelectric elements or other suitable elements, and the passive elements may include capacitors, resistors, inductors or other suitable elements, but not limited herein. In some embodiments, the chip 120 may include, for example, a processor chip, a power management integrated circuit (PMIC), an integrated voltage regulator (IVR), a memory chip or other suitable chips, but not limited herein.

The chip 120 may include an active surface 121 facing the second redistribution layer 130, and the chip 120 is electrically connected to the light-emitting elements 220 through the second redistribution layer 130 and the third redistribution layer 210. Specifically, the chip 120 may include a plurality of connection pads 122 and a plurality of bumps 123. The bumps 123 may include, for example, copper, tin, nickel, gold, lead or other suitable conductive materials, but not limited herein. The bumps 123 may be respectively disposed on the connection pads 122, and a surface of the chip 120 with the connection pads 122 may be referred to as the active surface 121, for example. Under this condition, the chip 120 may further include a back surface 124 opposite to the active surface 121, and the first package 100 may further include an adhesive layer 140 for attaching the back surface 124 of the chip 120 to the first redistribution layer 110. The adhesive layer 140 may include, for example, a die attach film (DAF), double-sided adhesive or other suitable materials, but not limited herein. By making the active surface 121 of the chip 120 face-up and face the second redistribution layer 130, the distance for signal transmission between the chip 120 and the light-emitting elements 220 may be shortened, thus improving the operating performance of the package structure 10. In addition, since the chip 120 may transmit signals to the light-emitting elements 220 through the second redistribution layer 130 and the third redistribution layer 210, the structure in which the first redistribution layer 110 and the second redistribution layer 130 have similar or the same number of the conductive layers CL may be achieved through the above design of reducing the number of the conductive layers CL in the second redistribution layer 130.

As shown in FIG. 1 and FIG. 2, the second package 200 may include at least three or a plurality of light-emitting elements 220, but not limited herein. In some embodiments, the number of the light-emitting elements 220 in the second package 200 may be adjusted according to practical requirements. The light-emitting elements 220 may include, for example, light source ICs or other suitable light-emitting elements, but not limited herein. Furthermore, the light-emitting elements 220 may respectively generate light of different colors, that is, the first surfaces 221 of the light-emitting elements 220 may respectively emit light of different colors. In some embodiments, the second package 200 may include three light-emitting elements 220, such as a red light-emitting element, a green light-emitting element and a blue light-emitting element, but not limited herein. In this case, the second package 200 may be used to generate white light, so that the package structure 10 may be applied to a display device. Through the coplanarity of the first surfaces 221, it may help to stably control the brightness of different colors, thereby displaying high-quality images. In some embodiments, the second package 200 may include four light-emitting elements 220, such as a red light-emitting element, a green light-emitting element, a blue light-emitting element and a white light-emitting element, but not limited herein. In some embodiments, at least two light-emitting elements 220 of the second package 200 may respectively generate light of different colors.

Each of the light-emitting elements 220 may further include a second surface 222, a plurality of connection pads 223 and a plurality of through silicon vias (TSVs) 224. In each light-emitting element 220, the second surface 222 is opposite to the first surface 221, and the second surface 222 faces the third redistribution layer 210. The connection pads 223 are located between the first surface 221 and the second surface 222 in the first direction D1. Each of the through silicon vias 224 extends vertically from the second surface 222 to the corresponding connection pads 223, and the third redistribution layer 210 may be electrically connected to the light-emitting elements 220 through the through silicon vias 224. Each of the through silicon vias 224 may be formed, for example, by forming a through hole in the light-emitting element 220 and filling the through hole with conductive material, in which the through hole may be filled up with the conductive material, or the conductive material may be conformally formed in the through hole depending on the size and aspect ratio of the through hole, but not limited herein. In the embodiment shown in FIG. 1, each of the light-emitting elements 220 may include four connection pads 223 and four through silicon vias 224, and each of the light-emitting elements 220 is electrically connected to the third redistribution layer 210 through these connection pads 223 and through silicon vias 224, but not limited herein. In some embodiments, the number of the connection pads 223 and the number of the through silicon vias 224 in each of the light-emitting elements 220 may be adjusted according to practical requirements. In some embodiments, each of the light-emitting elements 220 may further optionally include an optical element 225, and the optical element 225 may be disposed on the first surface 221, for example, disposed in the light-emitting region 221R of the first surface 221, but not limited herein.

As shown in FIG. 1, the first package 100 may further include a plurality of conductive pillars 150. The conductive pillars 150 are disposed between the first redistribution layer 110 and the second redistribution layer 130, and the second redistribution layer 130 is electrically connected to the first redistribution layer 110 through the conductive pillars 150. The chip 120 may be disposed between two of the conductive pillars 150. The first package 100 may further include an encapsulant material 160 (or referred to as a first encapsulant material), and the encapsulant material 160 may be disposed between the first redistribution layer 110 and the second redistribution layer 130 and surround the chip 120 and the conductive pillars 150. The encapsulant material 160 may include, for example, epoxy, ceramic powders, carbon black, other suitable materials or combinations of the above materials, but not limited herein.

The first package 100 may further optionally include an electronic element 170, and the electronic element 170 is disposed on a side of the first redistribution layer 110 opposite to the chip 120, that is, the chip 120 and the electronic element 170 may be respectively located on opposite two sides of the first redistribution layer 110. The electronic element 170 may include an active element 171 and/or a passive element 172, and the active element 171 and/or the passive element 172 may be electrically connected to the first redistribution layer 110. In the embodiment shown in FIG. 1, the electronic element 170 may be disposed on the first redistribution layer 110 through flip-chip bonding, for example, and an underfill material 173 may be optionally disposed between the electronic element 170 (e.g., the active element 171 and/or the passive element 172) and the first redistribution layer 110. The underfill material 173 may be, for example, capillary underfill (CUF), a non-conductive film (NCF) or other suitable materials, but not limited herein.

The first package 100 may further optionally include a plurality of conductive terminals 180. The conductive terminals 180 may be disposed on the side of the first redistribution layer 110 opposite to the chip 120, and the electronic element 170 may be, for example, located between two of the conductive terminals 180. For example, the conductive terminals 180 may include solder balls or bumps, and the conductive terminals 180 may include copper, tin, nickel, gold, lead or other suitable conductive materials, but not limited herein.

As shown in FIG. 1, the second package 200 may further include an encapsulant material 230 (or referred to as a second encapsulant material), and the encapsulant material 230 may be disposed on the third redistribution layer 210 and surround each of the light-emitting elements 220. The encapsulant material 230 may include, for example, epoxy, ceramic powders, carbon black, other suitable materials or combinations of the above materials, but not limited herein. The first surface 221 of each of the light-emitting elements 220 may not be covered by the encapsulant material 230. In some embodiments, a protective layer (e.g., the protective layer 226 shown in FIG. 11) may be optionally disposed on the first surfaces 221 exposed by the encapsulant material 230 to protect the first surfaces 221 of the light-emitting elements 220, but not limited herein.

The second package 200 may further include an electronic element 240, and the electronic element 240 may be disposed between the first package 100 and the third redistribution layer 210, that is, the light-emitting element 220 and the electronic element 240 may be respectively located on opposite two sides of the third redistribution layer 210. The electronic element 240 may include an active element 241 and/or a passive element 242, and the active element 241 and/or the passive element 242 may be electrically connected to the third redistribution layer 210. In the embodiment shown in FIG. 1, the electronic element 240 may be disposed on the third redistribution layer 210 through flip-chip bonding, for example, and an underfill material 243 may be optionally disposed between the electronic element 240 (e.g., the active element 241 and/or the passive element 242) and the third redistribution layer 210. The underfill material 243 may be, for example, capillary underfill (CUF), a non-conductive film (NCF) or other suitable materials, but not limited herein.

As shown in FIG. 1, the package structure 10 of this embodiment may further include a plurality of conductive terminals 300. The conductive terminals 300 are disposed between the third redistribution layer 210 and the second redistribution layer 130, and the third redistribution layer 210 is electrically connected to the second redistribution layer 130 through the conductive terminals 300. For example, the conductive terminals 300 may include solder balls or bumps, and the conductive terminals 300 may include copper, tin, nickel, gold, lead or other suitable conductive materials, but not limited herein. In some embodiments, the conductive terminals 300 and/or the conductive terminals 180 may include composite solder balls with certain support, so that the conductive terminals 300 and/or the conductive terminals 180 may still maintain a uniform thickness after bonding. Through the composite solder balls, the first package 100 and the second package 200 may have a uniform space therebetween, and/or the first package 100 and other elements bonded with the first package 100 through the conductive terminals 180 may have a uniform space therebetween, which may help to increase the planarity of the package structure 10, thereby improving the coplanarity of the first surfaces 221 of different light-emitting elements 220. For example, the composite solder ball may include a polymer core, a metal layer and a cover layer. The metal layer is disposed between the polymer core and the cover layer, the metal layer covers the polymer core, and the cover layer surrounds the metal layer. The metal layer may include, for example, copper, nickel or other suitable conductive materials. The polymer core may include, for example, plastic particles or other suitable materials. The cover layer may include, for example, tin, silver, tin-silver alloy or other suitable materials.

The package structure 10 of this embodiment may further include an underfill material 400, and the underfill material 400 may be disposed between the first package 100 and the second package 200 and surround the conductive terminals 300, so as to improve the reliability of the package structure 10. The underfill material 400 may include, for example, capillary underfill (CUF), a non-conductive film (NCF) or other suitable materials, but not limited herein.

Figure 3:
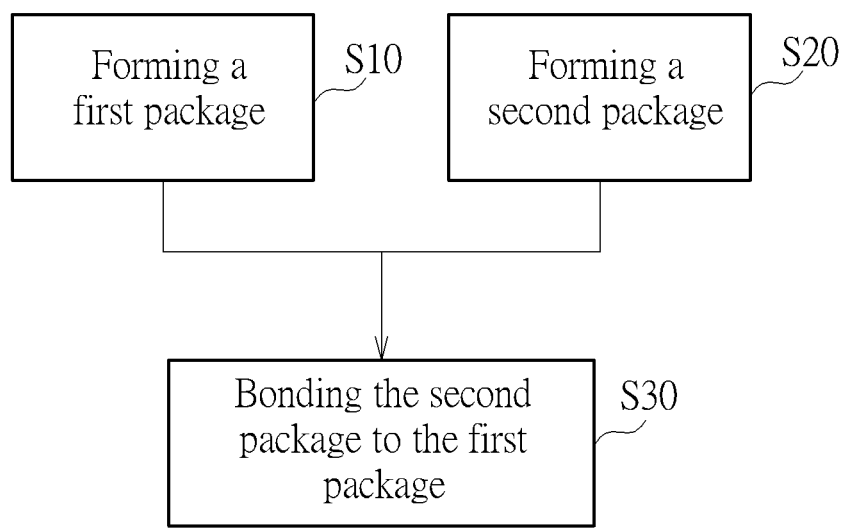
FIG. 3 is a flowchart of a manufacturing method of a package structure according to an embodiment of the present invention.

Please refer to FIG. 3 to FIG. 11. FIG. 3 is a flowchart of a manufacturing method of a package structure according to an embodiment of the present invention. FIG. 4 to FIG. 11 illustrates cross-sectional schematic diagrams of structures in different steps of a manufacturing method according to an embodiment of the present invention. As shown in FIG. 3, a manufacturing method provided by this embodiment may include Step S10 to Step S30, for example. First, as shown in Step S10, the first package 100 is formed, and as shown in Step S20, the second package 200 is formed. Then, Step S30 is performed to bond the second package 200 to the first package 100. Furthermore, Step S10 to Step S30 shown in FIG. 3 will be detailed below with reference to FIG. 1 and FIG. 4 to FIG. 11.

Figure 4:
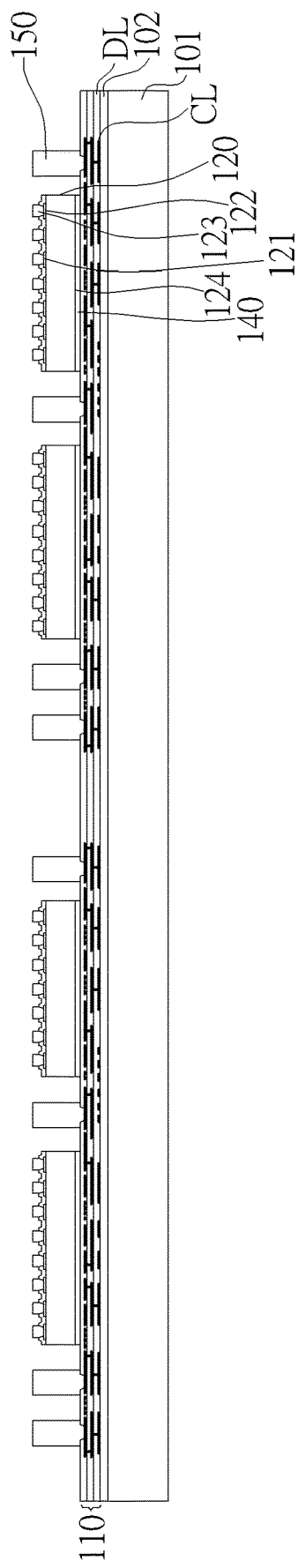
FIG. 4 to FIG. 11 illustrates cross-sectional schematic diagrams of structures in different steps of a manufacturing method according to an embodiment of the present invention.

Step S10 of forming the first package 100 may include the following steps. As shown in FIG. 4, a first carrier 101 is provided first. Then, the first redistribution layer 110 may be formed on the first carrier 101. The first redistribution layer 110 may be formed by alternately forming conductive layers CL and dielectric layers DL, for example. In this embodiment, a release layer 102 may be provided on the first carrier 101, and the first redistribution layer 110 is formed on the release layer 102, but not limited herein.

Then, after the first redistribution layer 110 is formed, a plurality of conductive pillars 150 may be formed on the first redistribution layer 110, and one or multiple chip(s) 120 may be disposed on the first redistribution layer 110. In this embodiment, the step of disposing the chip 120 may include attaching the back surface 124 of the chip 120 to the first redistribution layer 110 through an adhesive layer 140. It should be noted that, before the chip 120 is disposed on the first redistribution layer 110, bumps 123 may be optionally formed on the connection pads 122 of the chip 120 respectively, so as to reduce the damage to the connection pads 122 in the subsequent process. The number of the chips 120 may be determined, for example, according to the number of the chips in one first package 100 and/or the number of the first packages 100.

Figure 5:
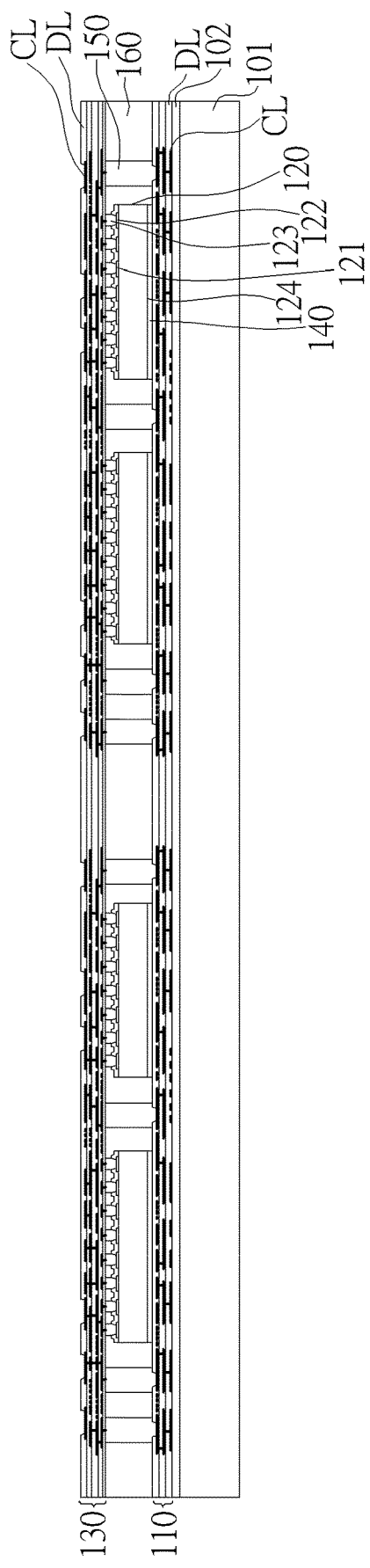

As shown in FIG. 5, after the chip 120 is disposed, the first encapsulant material 160 may be formed on the first redistribution layer 110, and the first encapsulant material 160 surrounds the chip 120 and the conductive pillars 150. In this embodiment, during the step of forming the first encapsulant material 160, the first encapsulant material 160 may cover and encapsulate the chip 120 and the conductive pillars 150 first, and then the first encapsulant material 160 may be thinned, for example, by a grinding process, to expose the upper surfaces of the bumps 123 of the chip 120 and the upper surfaces of the conductive pillars 150.

Then, after the first encapsulant material 160 is formed, the second redistribution layer 130 may be formed on the first encapsulant material 160 and electrically connected to the chip 120. For example, the second redistribution layer 130 is electrically connected to the bumps 123 of the chip 120, and the second redistribution layer 130 may be electrically connected to the first redistribution layer 110 through the conductive pillars 150. The second redistribution layer 130 may be formed by alternately forming the dielectric layers DL and the conductive layers CL, for example. In some embodiments, the first redistribution layer 110 and the second redistribution layer 130 may have similar or the same number of the conductive layers CL and/or have similar or the same number of the dielectric layers DL to reduce warpage.

Figure 6:
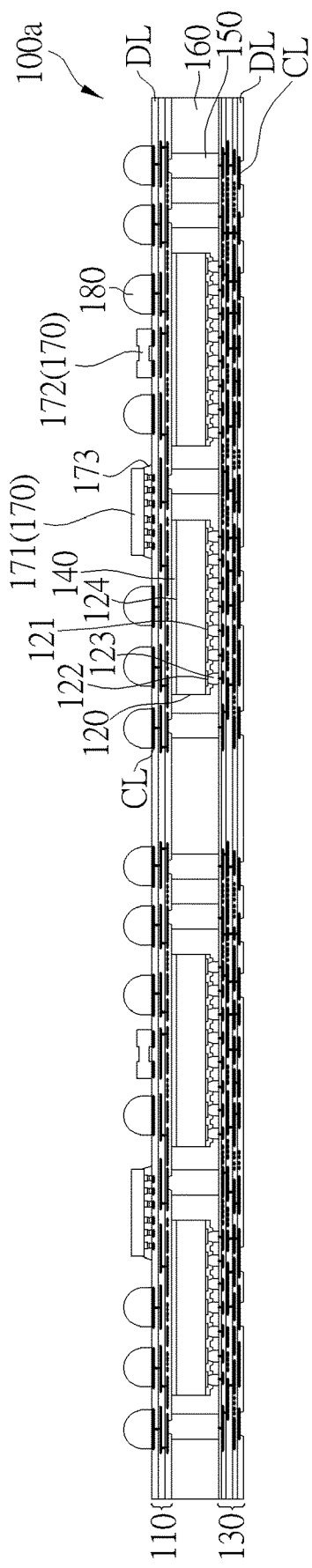

As shown in FIG. 6, after the second redistribution layer 130 is formed, the first carrier 101 and the release layer 102 may be removed, and the conductive layer CL of the first redistribution layer 110 which is farthest from the chip 120 may be exposed. In some embodiments, after the step of removing the first carrier 101 and the release layer 102, the whole structure may be flipped upside down, and an electronic element 170 may be optionally disposed on the side of the first redistribution layer 110 opposite to the chip 120. The electronic element 170 may include an active element 171 and/or a passive element 172, but not limited herein. For example, the electronic element 170 may be disposed on the first redistribution layer 110 by flip-chip bonding, and the underfill material 173 may be optionally disposed between the electronic element 170 (e.g., the active element 171) and the first redistribution layer 110, but not limited herein. Then, after the electronic element 170 is disposed, a plurality of conductive terminals 180 may be formed on the first redistribution layer 110. The electronic element 170 may be located between two of the conductive terminals 180. Thus, as shown in FIG. 6, a semi-finished structure 100a including one single first package 100 or a plurality of first packages 100 may be formed.

Figure 7:
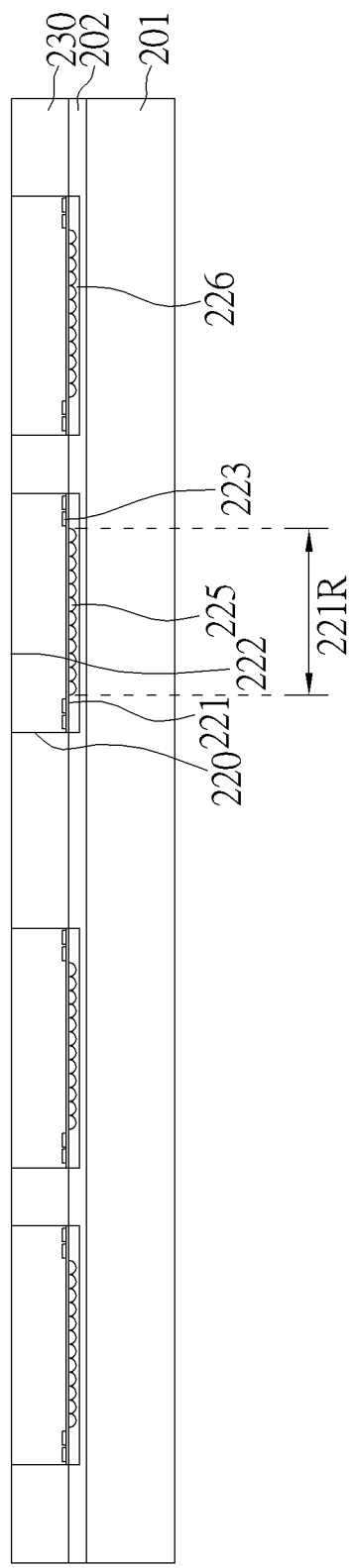

Step S20 of forming the second package 200 may include the following steps. As shown in FIG. 7, a second carrier 201 may be provided first. Then, at least three light-emitting elements 220 may be disposed on the second carrier 201. The first surface 221 of each of the light-emitting elements 220 faces the second carrier 201. By making the first surfaces 221 of the light-emitting elements 220 face-down and face the second carrier 201, the first surfaces 221 of the light-emitting elements 220 may be coplanar. In this embodiment, each of the light-emitting elements 220 may include the first surface 221, the second surface 222 and a plurality of the connection pads 223. The second surface 222 is opposite to the first surface 221, and the connection pads 223 are disposed between the first surface 221 and the second surface 222. Furthermore, a release layer 202 may be provided on the second carrier 201, and the light-emitting elements 220 are disposed on the release layer 202, but not limited herein. In some embodiments, each of the light-emitting elements 220 may further optionally include an optical element 225, and the optical element 225 may be disposed on the first surface 221, but not limited herein. In some embodiments, a protective layer 226 may be optionally provided on the first surface 221 of each of the light-emitting elements 220 to protect the light-emitting element 220 during the manufacturing process, but not limited herein. In other embodiments, no protective layer may be provided on the first surface 221 of each of the light-emitting element 220. The number of the light-emitting elements 220 may be determined, for example, according to the number of the light-emitting elements in one second package 200 and/or the number of the second packages 200.

Then, after the light-emitting elements 220 are disposed, the second encapsulant material 230 may be formed on the second carrier 201 to surround the light-emitting elements 220. In this embodiment, during the step of forming the second encapsulant material 230, the second encapsulant material 230 may cover and encapsulate the light-emitting elements 220 first, and then the second encapsulant material 230 may be thinned, for example, by a grinding process, to expose the second surfaces 222 of the light-emitting elements 220.

Figure 8:
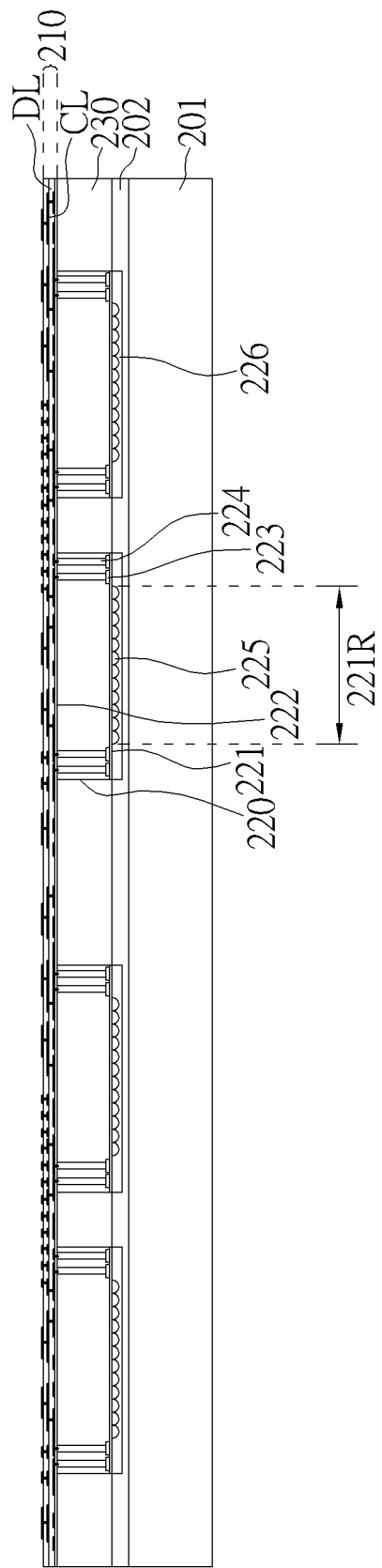

As shown in FIG. 8, after the second encapsulant material 230 is formed, the third redistribution layer 210 may be formed on the light-emitting elements 220 and electrically connected to the light-emitting elements 220. The third redistribution layer 210 may be formed by alternately forming the dielectric layers DL and the conductive layers CL, for example. In this embodiment, between the step of forming the second encapsulant material 230 and the step of forming the third redistribution layer 210, a plurality of through silicon vias 224 may be further formed in each of the light-emitting elements 220, and the third redistribution layer 210 is electrically connected to the light-emitting elements 220 through the through silicon vias 224. For example, a plurality of through holes may be formed in the light-emitting elements 220, and then conductive material may be filled in the through holes to form the through silicon vias 224, but not limited herein.

Figure 9:
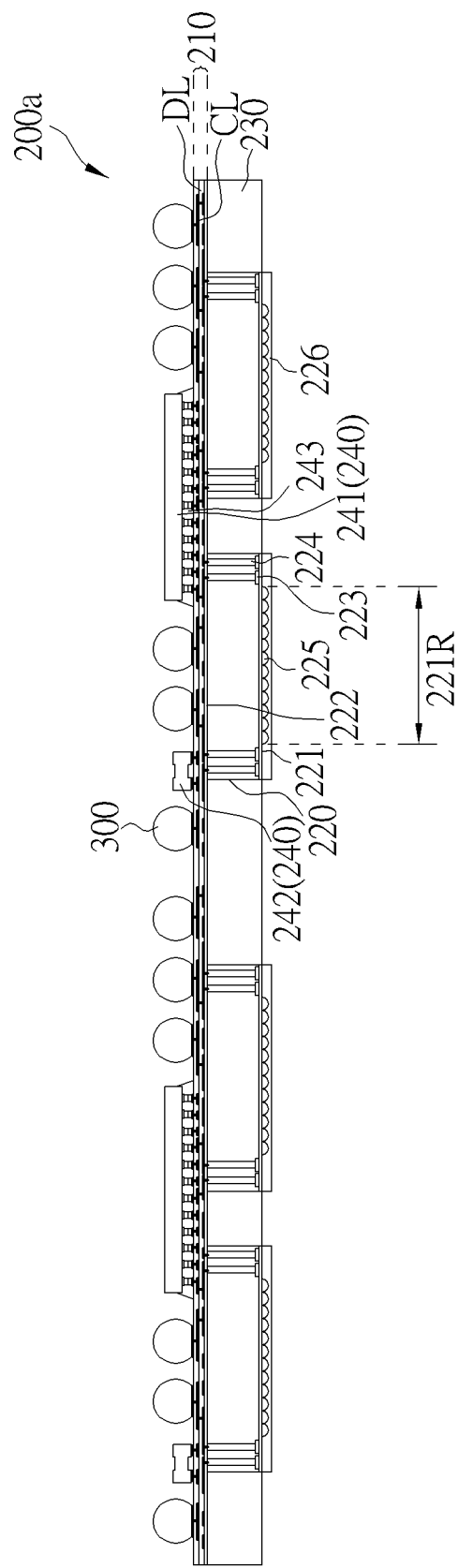

As shown in FIG. 9, after the third redistribution layer 210 is formed, the second carrier 201 and the release layer 202 may be removed, and the first surface 221 of each of the light-emitting elements 220 may be exposed. In some embodiments, when the protective layer 226 is provided on the first surface 221 of each of the light-emitting elements 220, the protective layer 226 on each of the light-emitting element 220 may be exposed, but not limited herein. Then, a plurality of conductive terminals 300 may be formed on a side of the third redistribution layer 210 opposite to the light-emitting elements 220. In some embodiments, after the step of forming the third redistribution layer 210, the second carrier 201 and the release layer 202 may not be removed, that is, the subsequent process may be performed on the second carrier 201, but not limited herein.

In some embodiments, after the third redistribution layer 210 is formed, the electronic element 240 may be further disposed on the side of the third redistribution layer 210 opposite to the light-emitting elements 220. The electronic element 240 may include an active element 241 and/or a passive element 242, but not limited herein. For example, the electronic element 240 may be disposed on the third redistribution layer 210 by flip-chip bonding, and an underfill material 243 may be optionally disposed between the electronic element 240 (e.g., the active element 241) and the third redistribution layer 210, but not limited herein. In some embodiments, the step of disposing the electronic element 240 may be performed before or after the conductive terminals 300 are formed. The step of removing the second carrier 201 may be performed before or after the steps of forming the conductive terminals 300 and disposing the electronic element 240, or between the step of forming the conductive terminals 300 and the step of disposing the electronic element 240. Thus, as shown in FIG. 9, a semi-finished structure 200a including one single second package 200 or a plurality of second packages 200 may be formed.

Figure 10:
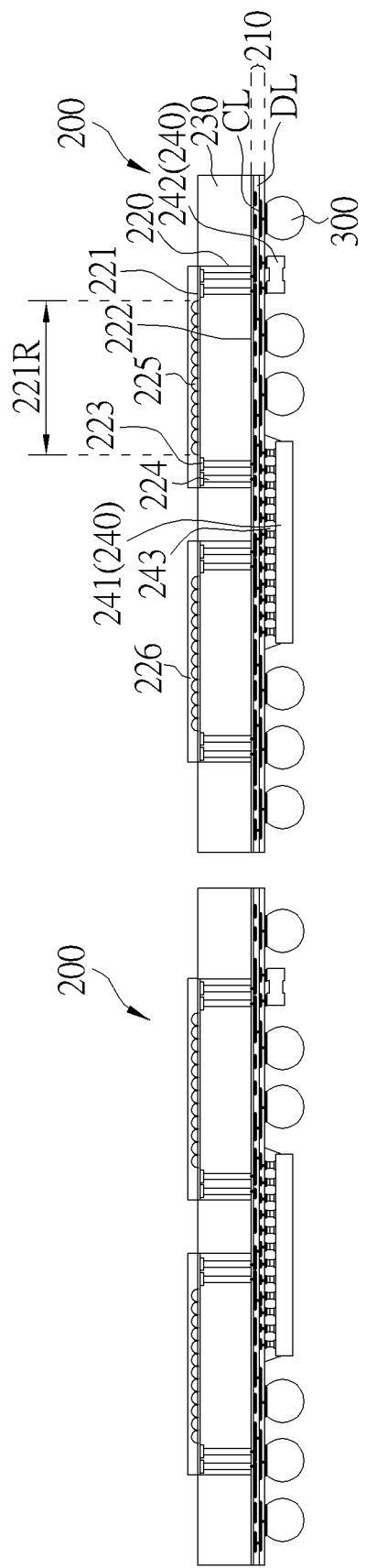

As shown in FIG. 10, after the semi-finished structure 200a is formed, a singulation process may be performed to form at least one second package 200. The singulation process may include, for example, a cutting process or other suitable processes. In the embodiment shown in FIG. 9 and FIG. 10, the semi-finished structure 200a may include a plurality of second packages 200, so the second packages 200 may be separated from each other by the singulation process. In the singulation process, the semi-finished structure 200 may be singulated according to the practical number of the light-emitting elements 220 required in one second package 200 to form a plurality of second packages 200. For example, each of the second packages 200 may include three or four light-emitting elements 220, but not limited herein.

Figure 11:
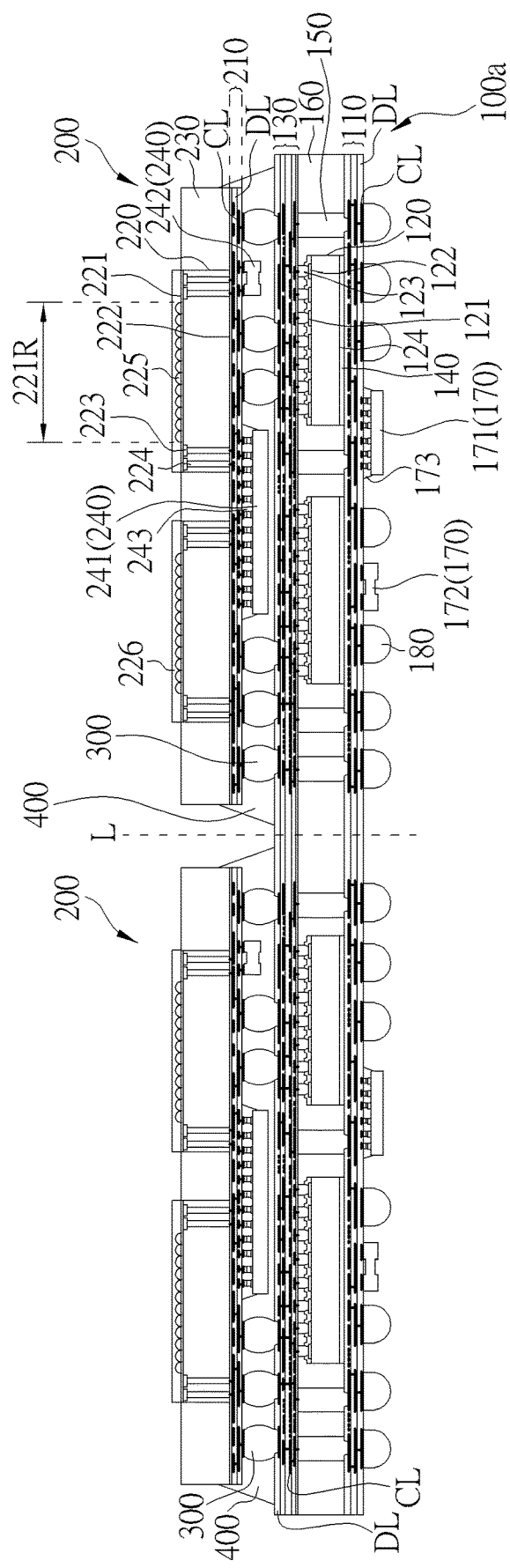

As shown in FIG. 11, after Step S10 and Step S20, Step S30 may be performed to bond the second package 200 to the first package 100. The third redistribution layer 210 of the second package 200 is electrically connected to the second redistribution layer 130 of the first package 100, and the second redistribution layer 130 is disposed between the chip 120 and the third redistribution layer 210. For example, one or multiple second package(s) 200 may be disposed on the semi-finished structure 100a, and the third redistribution layer 210 may be electrically connected and bonded to the second redistribution layer 130 through the conductive terminals 300. In some embodiments, the underfill material 400 may be further disposed between the first package 100 and the second package 200 to surround the conductive terminals 300, but not limited herein.

In the embodiments shown in FIG. 11, when the semi-finished structure 100a includes a plurality of first packages 100, the plurality of second packages 200 may be disposed on the semi-finished structure 100a, and then the singulation process may be performed along a dotted line L, so as to form a plurality of package structures 10 as shown in FIG. 1. In some embodiments, when the semi-finished structure 100a is one single first package 100, one second package 200 may be disposed on the semi-finished structure 100a, so as to form one single package structure 10 without a singulation process, but not limited herein. In some embodiments, if a protective layer 226 is provided on the first surface 221 of each of the light-emitting elements 220 (as shown in FIG. 10), the protective layer 226 may be removed after the singulation process, so that the first surface 221 of each of the light-emitting elements 220 is exposed, but not the limited herein.

From the above description, in the package structure and the manufacturing method thereof of the present invention, by packaging at least three light-emitting elements in the second package with the first surfaces thereof being coplanar, the second package may have better surface planarity. In addition, since the first redistribution layer and the second redistribution layer may have similar or the same number of conductive layers, the warpage may be reduced, thereby increasing the planarity of the whole structure. Furthermore, through the above arrangement and structure design of elements, the light-emitting elements, the chips and/or the electronic elements may be integrated in the package structure.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A package structure, comprising:
   a first package, comprising:
      a first redistribution layer;
      at least one chip disposed on the first redistribution layer; and
      a second redistribution layer disposed on a side of the chip opposite to the first redistribution layer and electrically connected to the first redistribution layer; and
   a second package disposed on the first package, and the second package comprising:
      a third redistribution layer electrically connected to the second redistribution layer, wherein the second redistribution layer is disposed between the chip and the third redistribution layer; and
      at least three light-emitting elements disposed on the third redistribution layer and electrically connected to the third redistribution layer, wherein each of the light-emitting elements comprises a first surface having a light-emitting region for generating light, the first surface is opposite to the third redistribution layer, and the first surfaces of the light-emitting elements are coplanar.

2. The package structure according to claim 1, wherein the first redistribution layer and the second redistribution layer have a same number of conductive layers.

3. The package structure according to claim 1, wherein the chip comprises an active surface facing the second redistribution layer, and the active surface of the chip is electrically connected to the light-emitting elements through the second redistribution layer and the third redistribution layer.

4. The package structure according to claim 3, wherein the chip further comprises a back surface opposite to the active surface, and the first package further comprises an adhesive layer for attaching the back surface of the chip to the first redistribution layer.

5. The package structure according to claim 1, wherein each of the light-emitting elements further comprises:
   a second surface opposite to the first surface and facing the third redistribution layer;
   a plurality of connection pads located between the first surface and the second surface; and
   a plurality of through silicon vias, wherein each of the through silicon vias extends from the second surface to each of the connection pads, and the third redistribution layer is electrically connected to the light-emitting elements through the through silicon vias.

6. The package structure according to claim 1, wherein the first package further comprises an electronic element disposed on a side of the first redistribution layer opposite to the chip.

7. The package structure according to claim 1, wherein the second package further comprises an electronic element disposed between the first package and the third redistribution layer.

8. The package structure according to claim 1, further comprising a plurality of conductive terminals disposed between the third redistribution layer and the second redistribution layer, wherein the third redistribution layer is electrically connected to the second redistribution layer through the conductive terminals.

9. The package structure according to claim 8, further comprising an underfill material disposed between the first package and the second package and surrounding the conductive terminals.

10. The package structure according to claim 1, wherein the first package further comprises a first encapsulant material disposed between the first redistribution layer and the second redistribution layer and surrounding the chip.

11. The package structure according to claim 1, wherein the second package further comprises a second encapsulant material disposed on the third redistribution layer and surrounding each of the light-emitting elements.

12. The package structure according to claim 1, wherein the first package further comprises a plurality of conductive pillars disposed between the first redistribution layer and the second redistribution layer, wherein the second redistribution layer is electrically connected to the first redistribution layer through the conductive pillars.

13. The package structure according to claim 1, wherein the light-emitting elements respectively generate light of different colors.

14. A manufacturing method of a package structure, comprising:
   forming a first package, comprising:
      forming a first redistribution layer on a first carrier;
      forming a plurality of conductive pillars on the first redistribution layer, and disposing a chip on the first redistribution layer;
      forming a first encapsulant material on the first redistribution layer, wherein the first encapsulant material surrounds the chip and the conductive pillars;

forming a second redistribution layer on the first encapsulant material, and electrically connecting the second redistribution layer to the chip, wherein the second redistribution layer is electrically connected to the first redistribution layer through the conductive pillars; and removing the first carrier;

forming a second package, wherein the second package comprises a third redistribution layer and at least three light-emitting elements, the light-emitting elements are disposed on the third redistribution layer and electrically connected to the third redistribution layer, wherein each of the light-emitting elements comprises a first surface having a light-emitting region for generating light, the first surface is opposite to the third redistribution layer, and the first surfaces of the light-emitting elements are coplanar; and bonding the second package to the first package, wherein the third redistribution layer is electrically connected to the second redistribution layer, and the second redistribution layer is disposed between the chip and the third redistribution layer.

15. The manufacturing method of the package structure according to claim 14, wherein the first redistribution layer and the second redistribution layer have a same number of conductive layers.

16. The manufacturing method of the package structure according to claim 14, wherein the step of forming the second package comprises:

providing a second carrier;

disposing the light-emitting elements on the second carrier, wherein the first surface of each of the light-emitting elements faces the second carrier;

forming a second encapsulant material on the second carrier to surround the light-emitting elements;

forming the third redistribution layer on the light-emitting elements;

removing the second carrier, and exposing the first surface of each of the light-emitting elements; and forming a plurality of conductive terminals on a side of the third redistribution layer opposite to the light-emitting elements.

17. The manufacturing method of the package structure according to claim 16, further comprising disposing an electronic element on the side of the third redistribution layer opposite to the light-emitting elements.

18. The manufacturing method of the package structure according to claim 16, wherein between the step of forming the second encapsulant material and the step of forming the third redistribution layer, the manufacturing method further comprises forming a plurality of through silicon vias in each of the light-emitting elements, wherein the third redistribution layer is electrically connected to the light-emitting elements through the through silicon vias.

19. The manufacturing method of the package structure according to claim 14, wherein the chip comprises an active surface and a back surface opposite to the active surface, and the step of disposing the chip comprises attaching the back surface of the chip to the first redistribution layer through an adhesive layer.

20. The manufacturing method of the package structure according to claim 14, wherein after the step of removing the first carrier, the manufacturing method further comprises:

disposing an electronic element on a side of the first redistribution layer opposite to the chip; and forming a plurality of conductive terminals on the first redistribution layer, wherein the electronic element is located between two of the conductive terminals.

* * * * *